(12) United States Patent
Tsai

(10) Patent No.: US 6,646,328 B2
(45) Date of Patent: Nov. 11, 2003

(54) CHIP ANTENNA WITH A SHIELDING LAYER

(75) Inventor: Chao Chieh Tsai, Taichung (TW)

(73) Assignee: Taiwan Semiconductor Manufacturing Co. Ltd., Hsin Chu (TW)

(*) Notice: Subject to any disclaimer, the term of this patent is extended or adjusted under 35 U.S.C. 154(b) by 0 days.

(21) Appl. No.: 10/044,356

(22) Filed: Jan. 11, 2002

(65) Prior Publication Data

US 2003/0132430 A1 Jul. 17, 2003

(51) Int. Cl.$^7$ ............................................. H01L 23/552
(52) U.S. Cl. ........................................ 257/659; 257/660
(58) Field of Search ................................. 257/659, 660, 257/297, 422, 921; 343/700, 700 MS, 895

(56) References Cited

U.S. PATENT DOCUMENTS

| | | | | |
|---|---|---|---|---|
| 5,455,594 A | * | 10/1995 | Blasing et al. | ........ 343/700 MS |
| 5,995,048 A | * | 11/1999 | Smithgall et al. | .... 343/700 MS |
| 6,424,315 B1 | * | 7/2002 | Glenn et al. | ................ 343/895 |

* cited by examiner

Primary Examiner—Thien Tran
(74) Attorney, Agent, or Firm—Tung & Associates

(57) ABSTRACT

An antenna structure is fabricated on a chip. The antenna structure includes a shielding layer, a dielectric layer and an antenna layer. The shielding layer includes a plurality of mutually isolated regions. The entire structure may be fabricated using conventional CMOS processes.

19 Claims, 2 Drawing Sheets

CHIP ANTENNA WITH A SHIELDING LAYER

TECHNICAL FIELD

The present invention is generally related to integrated circuits and more particularly to a combined antenna and circuit structure.

BACKGROUND OF THE INVENTION

Wireless communication devices and services have proliferated in recent years. Affordability and convenient access to personal communication services including cellular telephony (analog and digital), paging and emerging so-called personal communication services (PCS) has fueled the continued growth of a worldwide mobile communication industry. Numerous other wireless applications and areas show promise for sustained growth including radio frequency identification (RFID), various satellite-based communications, personal assistants, local area networks, device portability such as through the bluetooth™ protocol, etc.

Of course, this growth has been accompanied by the continuous development and improvement of integrated circuits. High levels of integration continue to be demanded. Radio frequency integrated circuits (RFIC) and monolithic microwave integrated circuits (MMIC) are evidence of this trend. RFIC and MMIC are now commonly further packaged with VLSI digital signal processors and microprocessors on circuit boards and in advanced multi-chip modules (MCM) which are characterized by mounting and interconnecting multiple bare chips on a substrate, base material or laminate. Mixed-signal integration in which various different functions such as RF, low-frequency analog and digital functions are desirable. At least one National Science Foundation (NSF) project is believed to be initiated to investigate methods for the direct integration of PCS band antennas on mixed-technology integrated circuits.

While single chip integration of the various analog, digital and RF functions remains desirable for reasons of reliability, cost, product performance, manufacturing and size among others, previous attempts at such combinations have generally not yielded satisfactory results. Low noise operation is a requirement in the successful transmission and reception of signals. However, transistors are noteworthy for their inherent noise creation. This is particularly acute in silicon CMOS technologies, which are known to have high noise factors at low frequencies, and in silicon bipolar technologies, which exhibit moderate noise factors at high frequencies. Undesirable coupling may generally be referred to herein as cross talk.

Proximal placement of radiating and receiving antenna structures with respect to the digital and analog circuitry has proven to be quite a challenge in the industry. Shielding techniques have generally proven to be unsatisfactory due to processing limitations with respect to the relatively large surface area required to be covered. Additionally, shielding has performance drawbacks and is an efficiency drain due to at least the undesirable image currents that are established.

SUMMARY OF THE INVENTION

Therefore, it is one object of the present invention to provide a high level of integration of the various functions of a wireless device.

It is a further object of the present invention to provide an on-chip antenna exhibiting satisfactory cross talk characteristics.

It is a further object of the present invention to provide an on-chip antenna exhibiting improved efficiency characteristics.

It is a further object of the present invention to provide an on-chip antenna in accordance with the preceding objects utilizing conventional CMOS compatible manufacturing processing methods.

In accordance with these and other objects and advantages, the present invention comprises a single-chip integrated circuit comprising a base portion including an integrated circuit, a substantially planar antenna and a shielding layer between the base portion and antenna. The shielding layer is characterized by a plurality of mutually isolated regions.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
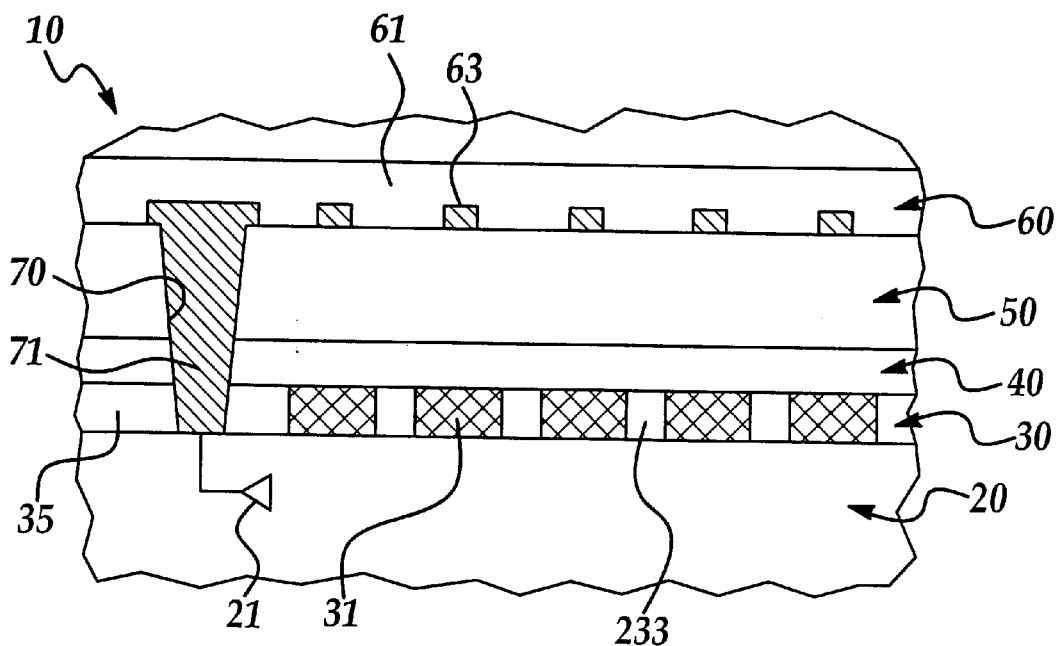
FIG. 1 is a sectional schematic diagram of an exemplary embodiment in accordance with the present invention.

According to one embodiment of the present invention FIG. 1 illustrates a sectional schematic of an integrated chip-antenna apparatus 10. Base portion 20 may include a variety of integrated circuits including both analog and digital circuitry. Chip 20 may also be referred to herein as a chip since it contains essentially all elements of a complete integrated circuit. Such circuitry may include for example microprocessors, digital signal processors, frequency converters and amplifiers. Power amplifier 21 is shown illustrated schematically in a driving configuration with its output coupled to antenna 63 as further described below. The circuitry contemplated herein for the chip 20 is any or all useful in a communication application. Examples of such are not exhaustively explored herein but are sufficiently well known to those skilled in the art. Also included in chip 20 are metallization traces, including multi-layered interconnects, also well known to those skilled in the art.

Adjacent shielding layer 30 includes a plurality of metal regions 31. Each metal region 31 is isolated one from the next. With additional reference to FIG. 3, these metal regions are illustrated in broken line and are labeled 231. Isolation between these metal regions 231 is provided by slots 233 which are filled with a suitable gap filling and planarization material (e.g. an intermetallic dielectric (IMD))

Next, a passivation layer 40 is atop the shielding layer 30. Adjacent passivation layer 40 is dielectric layer 50 having relatively high dielectric strength and low dielectric constant formulation.

On top of the dielectric layer 50 is antenna layer 60 including conductive antenna 63. With additional reference again to FIG. 3 the antenna is illustrated in solid line and is labeled 263. Alignment of the antenna 63, 263 and metal regions 31,231 can clearly be seen in both FIGS. 1 and 3. Finally, a suitable protective layer 61 covers the antenna 63.

Plug 71 provides conductive coupling of amplifier 21 to antenna 63 through shielding layer 30, passivation layer 40 and dielectric layer 50.

Figure 2:
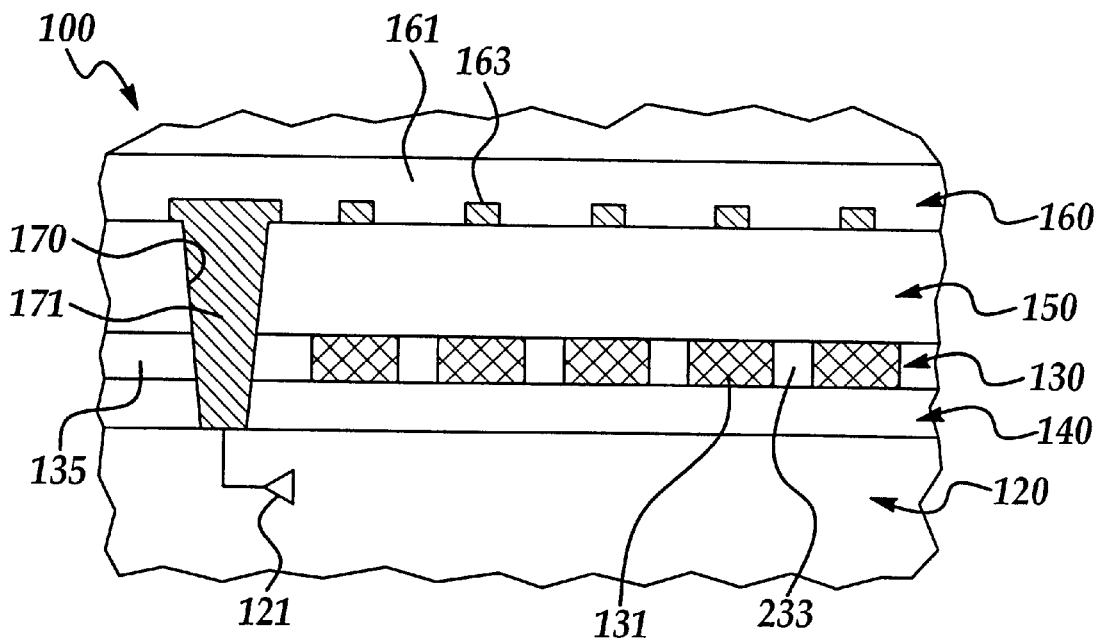
FIG. 2 is a sectional schematic diagram of an exemplary embodiment in accordance with the present invention; and, FIG. 3 is a top view of an exemplary embodiment displaying an antenna and a shielding layer in accordance with the present invention.

With further reference now to FIG. 2, an alternate embodiment in accordance with the invention is illustrated. Here, too, a sectional schematic illustrates an integrated chip-antenna apparatus 100. Region 120 represents a chip that may include a variety of integrated circuits as previously described with respect to chip 20 of FIG. 1.

Next, a passivation layer 140 is atop the chip 120. Adjacent passivation layer 140 is shielding layer 130 including a plurality of metal regions 131. Each metal region 31 is isolated one from the next as previously described. With additional reference to FIG. 3, these metal regions are illustrated in broken line and are labeled 231. Isolation between these metal regions 231 is provided by slots 233 which are filled with a suitable gap filling and planarization material.

Adjacent to the shielding layer 131 is dielectric layer 150 having relatively high dielectric strength and low dielectric constant formulation.

On top of the dielectric layer 150 is antenna layer 160 including conductive antenna 163. With additional reference again to FIG. 3 the antenna is illustrated in solid line and is labeled 263. Alignment of the antenna 163, 263 and metal regions 131,231 can clearly be seen in both FIGS. 1 and 3. Finally, a suitable protective layer 161 covers the antenna 163.

Plug 171 provides conductive coupling of amplifier 121 to antenna 163 through passivation layer 140, shielding layer 130 and dielectric layer 150.

Figure 3:
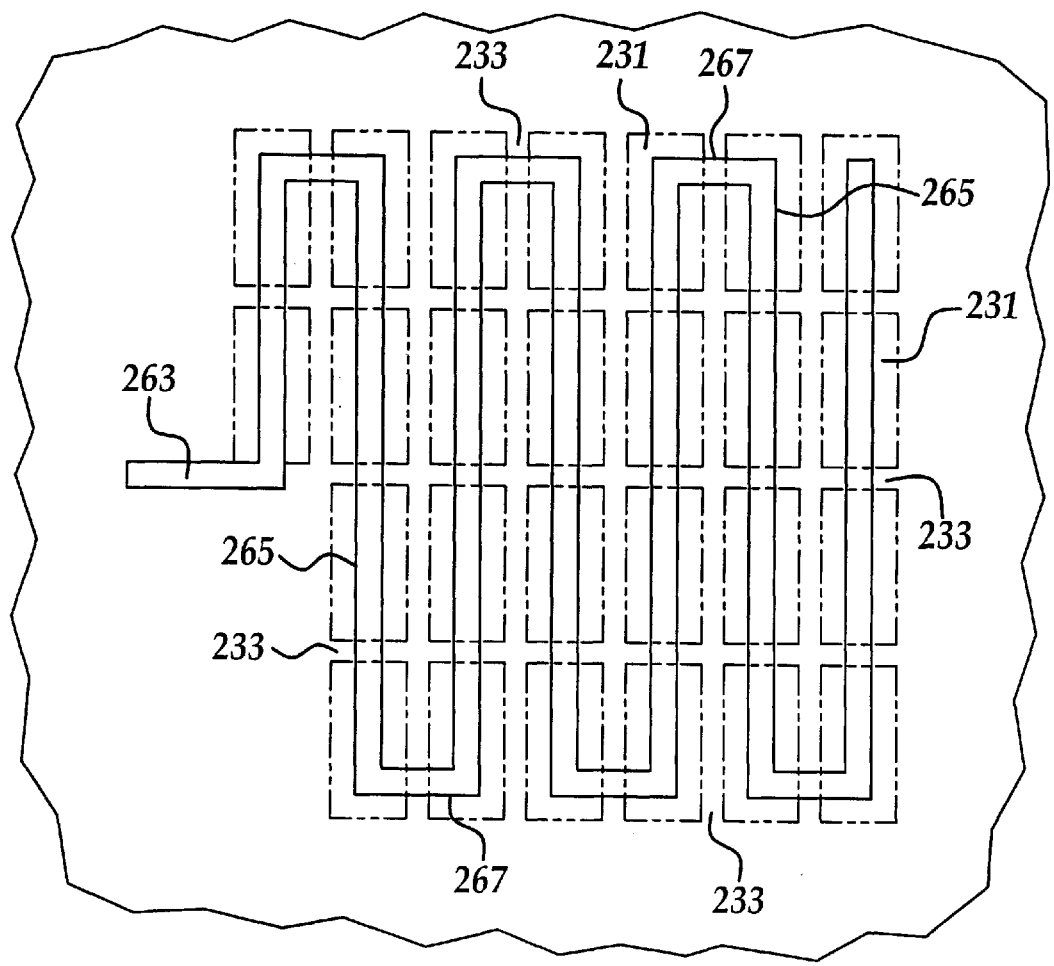

As mentioned, FIG. 3 is a top view of one embodiment of an antenna 263 and shielding layer including mutually isolated regions 231 in accordance with the present invention. In addition to the illustrated slots 233, FIG. 3 clearly shows an exemplary serpentine antenna pattern. The serpentine pattern of antenna 263 includes regions thereof characterized by extended runs 265 and shorter turns 267 which provide directional change for runs 265. Furthermore, while the mutually isolated regions 31, 131, 231 are generally below the antenna 63, 163, 263, it is preferred that the these regions 31, 131, 231 are characterized by a width that is at least that of the corresponding antenna portion and further preferably that the width is greater than the corresponding antenna portion. Each of the regions is separated from adjacent regions by slots 233. The slots that are perpendicular to (or cutting across) the antenna runs have demonstrated some benefit in reducing image currents thereby increasing antenna efficiency. Moreover, the slots also benefit the processing as they reduce the effective copper dishing due to the chemical mechanical polish (CMP) processing upon the shielding layer as described with respect to manufacturing steps below.

Manufacturing of the structures described can be accomplished using well-known processing steps commonly practiced in CMOS fabrication. Exemplary process steps and materials are exemplified below; however, it is to be understood that alternative steps within the skill of one skilled in the art may be substituted in place of such examples.

In the exemplary embodiment displayed in FIG. 1 wherein shielding layer 30 is shown adjacent the chip 20, the same metallization process utilized for the circuitry interconnects is employed to establish the mutually isolated regions 31. In this case, it may be preferred that the top layer of the chip 20 just prior to the shielding layer comprises a conventional IMD layer.

Conventional physical vapor deposition (PVD) or plating steps may be used in depositing a metal layer atop the chip 20. PVD processes include evaporation, e-beam evaporation, plasma spray deposition, and sputtering are all acceptable processes. Aluminum and tungsten are two of the more commonly used metals for interconnects and so also provide for acceptable shielding layer metallization. Copper, gold or alloys such as aluminum-copper and titanium-tungsten may also be employed as can any other conductor. However, certain metals such as copper and tungsten are very difficult materials to etch and are not preferred materials for the present exemplary metallization process. Patterning of the layer to establish the mutually isolated regions is then accomplished by lithographic and reactive ion etching (RIE) processes to open the slots 233 which separate the regions.

The slots 233 are required to be filled with filler 35 and the layer planarized prior to continuing to the next step. Spin-on-glass (SOG) material, such as silicate SOG and siloxane SOG, among others, may be utilized similar to an IMD layer process. One notable drawback to a silicate SOG is its tendency for large volume shrinkage post curing which can result in high residual stress and cracking thereby compromising the dielectric function. Selection of the SOG material is as much a function of preferences in processing and materials as it is the geometries of the shielding regions and slots being fabricated. SOG liquid can be dispensed onto a wafer and then spun-out at a predetermined speed to yield a specific thickness. After curing, the SOG is etched back or otherwise planarized to obtain a smooth surface. Simple chemical vapor deposition (CVD) of TetraEthylOrthoSilicate (TEOS) also may be used as a primary process or in combination with SOG. Alternately, an FSG process may be utilized in the slot fill and planarization. An FSG layer is formed by high-density plasma chemical vapor deposition (HDP-CVD). The FSG layer fills in the gaps between the metal lines and covers the metal layer thereby forming peaks corresponding to or overlying the metal lines. The peaks of the FSG layer are CMP processed to reduce the peaks and provide a more planar oxide above the metal. It may be necessary with FSG to form an undoped oxide layer, such as undoped silicate glass (USG), on the FSG layer and then chemically mechanically polished to planarize the shielding layer 30, if necessary, before ending the process.

Alternatively to the generally described metal deposition/etch/fill process to establish the shielding layer, the damascene technique may be employed where a metal conductor pattern is embedded in a dielectric film on the chip, resulting in a planar shielding layer. The damascene technique is particularly advantageous with metals, such as copper, that are very difficult to etch. Essentially, this technique begins with deposition of a dielectric layer, typically an oxide, atop the chip 20. This layer may be a planarized passivation layer atop the chip. A photoresist is then placed over the oxide layer and is photolithographically processed to establish the pattern (trenching) of the regions to be metalized. An anisotropic oxide etch is then used to etch out the oxide layer and form the metal region openings (trenches). Electrochemical plating (ECP) is then performed and generally includes the following steps. A thin adhesion layer of barrier material is deposited to coat the walls of the region openings to ensure good adhesion of a subsequent barrier layer which itself is deposited to prevent diffusion of subsequent bulk metallization into the oxide layer. The adhesion layer is generally followed with deposition of a seed layer and then the bulk material. Alternatively, collimated sputtering, ion cluster beam, electron cyclotron resonance, or CVD may be used to deposit the copper in the metal region openings. Planarizing is then performed such as by chemical-mechanical polishing (CMP) techniques that remove the material above the oxide layer.

Subsequent to the shielding layer, passivation layer 40 is deposited. Undoped-silicate glass (USG) and silicon nitride are exemplary materials for the passivation layer. Both are conventionally deposited by chemical vapor deposition (CVD), or plasma assisted CVD. The passivation layer 40 can be planarized by a CMP or etch back process.

Pad and via window openings are next opened. This includes the pad windows (not shown) for the chip circuitry and may include via 70 for the antenna 63 to chip 20 interconnect. Conventional mask and etch processes provide for the removal of the desired material in the passivation layer 40 and shielding layer 30 oxide 35. Alternatively, via 70 may be opened in subsequent processing steps as described below with respect to the antenna layer.

Dielectric layer 50 of polyimide or alternate dielectric of high dielectric strength is deposited. Polyimides are typically applied in liquid form, and then thermally cured into a film or layer. USG is one alternate material meeting the dielectric objectives. USG may be deposited by chemical vapor deposition (CVD), or a high-density plasma (HDP) oxide. The layer can be planarized by a CMP or etch back process. Silicon dioxide and silicon nitride are useful as interlayer dielectrics and insulators and may be used as alternative materials for the dielectric layer. As between these two alternate glasses, silicon nitride exhibits a higher dielectric strength and may for that reason be preferred over silicon dioxide in this role.

Next, via 70 is opened through the dielectric layer 50, passivation layer (and shield layer 30 if not previously opened) in a multi-layer mask and etch processes. Plug 71 is deposited to provide the connection between the chip (amplifier 21) and the antenna 63. A convention plug filling process such as selective tungsten deposition or CVD techniques. A planarization process such as CMP is employed at this stage to ensure adequate planarity for the patterning to follow and for antenna 63 formation. Alternatively, via patterning and etching may be combined with later patterning and etching steps in establishment of the antenna 63. For example, a dual damascene process may be performed where the plug and antenna are to be the same conductor, for example copper.

Preferably, the antenna 63 is plated such as by ECP in a damascene process. This, of course, requires trench establishment in a dielectric layer substantially as described previously with respect to one alternate manner of establishing the shielding layer structures by way of a damascene process. CMP planarization may subsequently be performed and a protective passivation layer deposited over the antenna. Polyimide is one preferred material to provide this final protective layer. Alternatively, a metal layer may be deposited upon the dielectric layer 50 and the metal patterned and etched to provide the antenna 63 pattern. Such alternate deposition may be by way of plating, sputtering, CVD or any other metal deposition process.

It may be that the conductor material selected for the metallization layers of the chip influences the selection of the conductor material for the antenna. Similar processing steps and stations would suggest similar or identical conductor materials be chosen. Copper, gold, aluminum or alloys such as aluminum-copper and titanium-tungsten may be employed as can any other conductor. Aluminum metallization on the chip may therefore lead to selection of aluminum as the conductor of choice for the antenna 63 since the material and process compatibility is high. However, in such low power critical applications such as RF, performance considerations may dictate that minimization of metal interconnect resistance is paramount. In such cases, the fewer dissimilar metal interconnects the better. Hence, a process such as a dual damascene process may be used to pattern and etch the antenna via 70 and trenches for the antenna 63 whereby a monometallic plug 71 and antenna 63 may be formed. In fact, if a damascene technique is utilized in the fabrication of the shielding regions 31, it follows that both the processing and performance efficiency considerations are aligned and copper may be the preferred conductor. If in fact copper is the conductor of choice for the metallization layers of the chip, additional benefit vis-à-vis one less dissimilar metal interconnect between the plug 171 and the chip circuitry (amplifier 21) is available where copper is selected as the material for the antenna.

In the exemplary embodiment displayed in FIG. 2, chip 120 after having all interconnects fabricated is coated with a passivation layer 140 such as silicon nitride for example. Undoped-silicate glass (USG) is an exemplary alternative material for the passivation layer 140. Both materials are conventionally deposited by chemical vapor deposition (CVD), or plasma assisted CVD. The passivation layer 40 can be planarized by a CMP or etch back process to provide a quality surface for antenna layer 130 and via 170 opened at the same time as the pad vias (not shown) are opened through the passivation layer 140.

Conventional physical vapor deposition (PVD) or plating steps may be used in depositing a metal layer atop the chip 20. Aluminum and tungsten are two of the more commonly used metals for interconnects and so also provide for acceptable shielding layer metallization. Copper, gold or alloys such as aluminum-copper and titanium-tungsten may also be employed as can any other conductor. However, certain metals such as copper and tungsten are very difficult materials to etch and are not preferred materials for the present exemplary metallization process. Patterning of the layer to establish the mutually isolated regions is then accomplished by lithographic and reactive ion etching (RIE) processes to open the slots 233 which separate the regions.

The slots 233 are required to be filled as in the previous embodiment with filler 135 and the layer planarized prior to continuing to the next step. Spin-on-glass (SOG) material, such as silicate SOG and siloxane SOG, among others, may be utilized similar to an IMD layer process. SOG liquid can be dispensed onto a wafer and then spun-out at a predetermined speed to yield a specific thickness. After curing, the SOG is etched back or otherwise planarized to obtain a smooth surface. Simple chemical vapor deposition (CVD) of TetraEthylOrthoSilicate (TEOS) also may be used as a primary process or in combination with SOG. Alternately, an FSG process substantially as described with respect to the shielding layer of FIG. 1 may be utilized in the slot fill and planarization.

The remaining steps and alternatives for completion of the various layered structures of the embodiment of FIG. 2 are substantially as described with respect to equivalent structures of the embodiment of FIG. 1 beginning with the dielectric layer 150 and continuing up through the antenna layer 160. All alternative materials and processes described with respect to the fabrication of the embodiment of FIG. 1 are applicable to the fabrication of the embodiment of FIG. 2.

The invention has been described with respect to certain preferred embodiments to be taken by way of example and not by way of limitation. Certain alternative implementations and modifications may be apparent to one exercising ordinary skill in the art. Therefore, the scope of invention as disclosed herein is to be limited only with respect to the appended claims.

The embodiments of the invention in which an exclusive property or privilege is claimed are defined as follows:

What is claimed is:

1. A single-chip integrated circuit comprising:
   a base portion including an integrated circuit;
   a substantially planar antenna; and,
   a shielding layer between the base portion and antenna effective to shield cross talk between the base portion and the antenna, said shielding layer characterized by a plurality of mutually isolated regions.

2. The single-chip integrated circuit as claimed in claim 1 wherein the base portion comprises:
   an amplifier section coupled to the antenna; and
   at least one of additional sections selected from the group consisting of of a frequency converter, a digital signal processor, and a microprocessor.

3. The single-chip integrated circuit as claimed in claim 1 wherein the base portion comprises a mixed-signal integrated circuit.

4. The single-chip integrated circuit as claimed in claim 1 wherein the antenna is characterized by a continuous pattern and each of the plurality of mutually isolated regions is substantially aligned beneath a corresponding portion of said continuous pattern.

5. The single-chip integrated circuit as claimed in claim 4 wherein each of said plurality of mutually isolated regions is at least as wide as the corresponding portion of the continuous pattern.

6. The single-chip integrated circuit as claimed in claim 1 wherein the base portion comprises an amplifier section coupled to the antenna.

7. The single-chip integrated circuit as claimed in claim 6 wherein the antenna is coupled to the amplifier through a dielectric layer between the antenna and shielding layer.

8. The single-chip integrated circuit as claimed in claim 6 wherein the antenna is coupled to an output of the amplifier.

9. The single-chip integrated circuit as claimed in claim 6 wherein the antenna is coupled to an input of the amplifier.

10. The single-chip integrated circuit as claimed in claim 1 wherein the antenna is characterized by a generally serpentine pattern and each of said plurality of mutually isolated regions is at least as wide as the corresponding portion of the generally serpentine pattern.

11. The single-chip integrated circuit as claimed in claim 10 wherein the generally serpentine pattern is characterized by runs and turns and said plurality of mutually isolated regions are substantially aligned beneath said runs.

12. The single-chip integrated circuit as claimed in claim 11 wherein each of the plurality of mutually isolated regions is at least as wide as the corresponding portion of said runs.

13. The single-chip integrated circuit as claimed in claim 11 wherein each of the plurality of mutually isolated regions is wider than the corresponding portion of said runs.

14. A single-chip integrated circuit comprising, in relative order;
   a silicon substrate including circuitry;
   a first metallization layer characterized by a plurality of mutually isolated metal regions;
   a dielectric layer; and,
   a second metallization layer characterized by an antenna pattern,
   wherein said first metallization layer is effective to shield cross talk between the silicon substrate and the second metallization layer.

15. A single-chip integrated circuit as claimed in claim 14 further including a passivation layer between said first metallization layer and said dielectric layer.

16. A single-chip integrated circuit as claimed in claim 14 further including a passivation layer between said silicon substrate and said first metallization layer.

17. A single-chip integrated circuit as claimed in claim 14 wherein said plurality of mutually isolated metal regions comprises metal selected from the group consisting of aluminum, copper and gold.

18. A single-chip integrated circuit as claimed in claim 14 wherein said antenna pattern comprises metal selected from the group consisting of aluminum, copper, gold, titanium and tungsten.

19. A single-chip integrated circuit as claimed in claim 14 wherein said antenna pattern comprises a titanium and tungsten alloy.

* * * * *